(12) United States Patent
Mang et al.

(10) Patent No.: US 11,997,816 B2
(45) Date of Patent: May 28, 2024

(54) SUBSTRATE MAGAZINE, SUBSTRATE MAGAZINE SYSTEM AND SUBSTRATE PLACEMENT SYSTEM

(71) Applicant: Asys Automatisierungssysteme GmbH, Dornstadt (DE)

(72) Inventors: Klaus Mang, Blaubeuren (DE); Jurgen Lehner, Laichingen (DE)

(73) Assignee: ASYS AUTOMATISIERUNGSSYSTEME GMBH, Dornstadt (DE)

( * ) Notice: Subject to any disclaimer, the term of this patent is extended or adjusted under 35 U.S.C. 154(b) by 659 days.

(21) Appl. No.: 16/945,335

(22) Filed: Jul. 31, 2020

(65) Prior Publication Data
US 2021/0037667 A1 Feb. 4, 2021

(30) Foreign Application Priority Data

Aug. 1, 2019 (DE) ...................... 10 2019 211 603.5

(51) Int. Cl.
*H05K 7/14* (2006.01)
*H05K 13/00* (2006.01)
(52) U.S. Cl.
CPC ......... *H05K 7/1405* (2013.01); *H05K 7/1421* (2013.01); *H05K 13/0084* (2013.01)
(58) Field of Classification Search
CPC . H05K 7/1405; H05K 7/1421; H05K 13/0084
USPC ....................................................... 361/724
See application file for complete search history.

(56) References Cited

U.S. PATENT DOCUMENTS 3,950,057 A * 4/1976 Calabro ............... H05K 7/1418
361/802
4,223,973 A * 9/1980 Tamburro ............ H05K 7/1405
439/377
4,232,356 A * 11/1980 Saunders ............. H05K 7/1425
361/784
(Continued)

FOREIGN PATENT DOCUMENTS

CN 103673489 A 3/2014
CN 106686936 A 5/2017
(Continued)

OTHER PUBLICATIONS

European Search Report dated Dec. 9, 2020 in EP Application No. 20188845.0.
(Continued)

*Primary Examiner* — Zhengfu J Feng
(74) *Attorney, Agent, or Firm* — Knobbe, Martens, Olson & Bear LLP

(57) ABSTRACT

A substrate magazine for a substrate insertion system, having a frame in which several drawers for receiving in each case at least one flat substrate are arranged one above the other. Each drawer is formed by two guide rails, arranged in parallel and at a distance from one another at the same height as that of the frame, each with a sliding surface on which a substrate lying on the edge can be displaced. At least one elastically displaceable latching element is assigned to each drawer. In a first, unloaded state, the at least one latching element extends at least partially over the sliding surface of one of the guide rails of the drawer and, in a second, elastically deformed state, releases the sliding surface.

16 Claims, 3 Drawing Sheets

(56) References Cited

U.S. PATENT DOCUMENTS

| | | | | |
|---|---|---|---|---|
| 4,323,161 A * | 4/1982 | Marconi | ............ | H05K 7/1425 211/41.17 |
| 4,725,182 A | 2/1988 | Sakamoto | | |
| 5,187,648 A * | 2/1993 | Ito | ............ | H05K 7/1418 361/756 |
| 5,533,631 A * | 7/1996 | Marchetti | ............ | H05K 7/1418 361/756 |
| 2002/0109977 A1* | 8/2002 | Megason | ............ | H05K 7/1418 361/801 |
| 2015/0108029 A1 | 4/2015 | Lim | | |
| 2015/0123528 A1 | 5/2015 | Wu | | |
| 2018/0040999 A1* | 2/2018 | Yamamoto | ............ | G06F 1/185 |
| 2018/0342826 A1* | 11/2018 | Leivers | ............ | H01R 12/91 |
| 2019/0334264 A1* | 10/2019 | Bekke | ............ | H01R 12/716 |
| 2021/0267104 A1 | 8/2021 | Lehner et al. | | |

FOREIGN PATENT DOCUMENTS

| | | | | |
|---|---|---|---|---|
| DE | 85 32 243 U1 | 1/1986 | | |
| DE | 38 33 703 A1 | 4/1990 | | |
| DE | 298 10 499 U1 | 10/1998 | | |
| DE | 299 05 922 U1 | 7/1999 | | |
| DE | 20008212 U1 | 7/2000 | | |
| DE | 199 19 188 A1 | 11/2000 | | |
| DE | 202020103705 U1 | 7/2020 | | |
| DE | 10 2019 211 603 | 2/2021 | | |
| EP | 0 123 167 A2 | 10/1984 | | |
| FR | 2 629 668 A1 | 10/1989 | | |
| JP | S61-206740 A | 9/1986 | | |
| JP | H04-100105 U | 8/1992 | | |
| JP | H0561109 U | 8/1993 | | |
| JP | 2002 110776 A | 4/2002 | | |
| JP | 2008 137673 A | 6/2008 | | |
| KR | 200167870 Y1 * | 2/2000 | ............ | H05K 9/0016 |
| KR | 100 618 421 B1 | 8/2006 | | |
| SE | 459544 B * | 7/1989 | ............ | H05K 7/1418 |

OTHER PUBLICATIONS

First Office Action dated Apr. 12, 2023 in Chinese Application No. 202110215286.5.
First Office Action dated Apr. 13, 2023 in Chinese Application No. 202010769385.3.

* cited by examiner

SUBSTRATE MAGAZINE, SUBSTRATE MAGAZINE SYSTEM AND SUBSTRATE PLACEMENT SYSTEM

PRIORITY AND CROSS REFERENCE TO RELATED APPLICATIONS

This application claims the priority benefit of German Application No. DE 10 2019 211 603.5, filed Aug. 1, 2019, the entirety of which is incorporated by reference herein.

FIELD

The present application relates to substrate magazines, substrate magazine systems, and substrate insertion systems.

BACKGROUND

Substrate magazines are known. In substrate insertion systems or production lines for printed circuit boards, printed circuit boards or printed circuit board blanks are generally removed from a magazine and placed in one or another magazine after the printed circuit boards have been populated with electrical and/or electronic components. This is often done by means of an automatic loading and unloading device for printed circuit board magazines.

SUMMARY

Some embodiments relate to a substrate magazine for a substrate insertion system, having a frame in which several drawers for receiving in each case at least one flat substrate—in particular, a circuit board wafer, solar cell or carrier, made, for example, of plastic or ceramic—are arranged one above the other, wherein each drawer is formed by two guide rails, arranged in parallel and spaced apart from one another at the same height as that of the frame, each with a sliding surface on which a substrate lying on the edge can be displaced.

Some other embodiments relate to a substrate magazine system and a substrate insertion system having at least one substrate magazine which is designed as described above.

DETAILED DESCRIPTION

Figure 1:
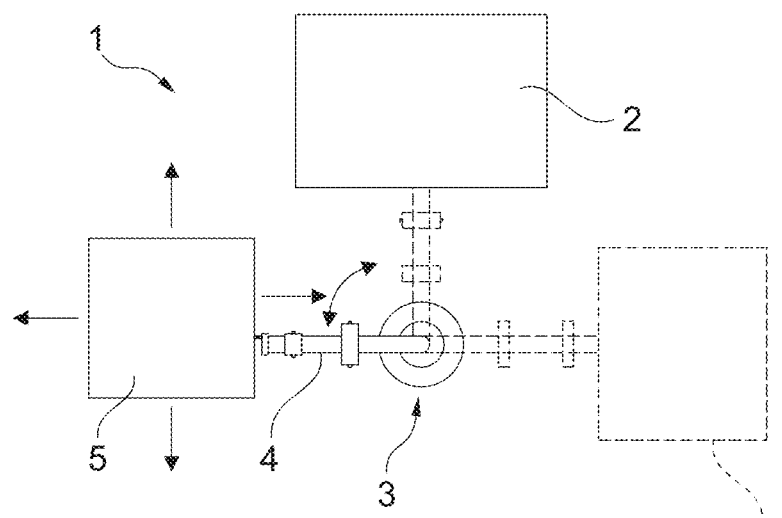
FIG. 1 shows a substrate insertion system in a simplified view.

Conventional magazines frequently have up to 50 drawers which are arranged one above the other and in each of which a single printed circuit board can be stored. The drawer is generally formed by two lateral guide rails, each of which has a sliding surface for the printed circuit board on which the respective printed circuit board rests on the edge. The edge-side support ensures that the central section of the printed circuit board that may already be provided with inserted components is free from contact with the magazine, so that already inserted components are not damaged by contact. The guide rails are arranged at the same height as that of the frame at a distance from one another. Given a sufficient length of the guide rails and shortness of the printed circuit boards, it is also possible to push several printed circuit boards in one drawer, one behind the other. In this case, the printed circuit boards are either abutting or spaced from one another in the sliding direction. When transporting the magazine from the substrate insertion system to, for example, a mounting system, by means of which the printed circuit boards or substrates are removed from the substrate magazine and supplied for their intended purpose, the printed circuit boards or substrates can slip in the substrate magazine and, in the worst case, be shoved onto each other. As a result, on the one hand, components of the respective printed circuit board can be damaged, and, on the other, the correct removal of the substrates from the substrate magazine can be made more difficult.

Some embodiments are based upon the aim of providing an improved substrate magazine which allows secure transport of the substrate magazine—in particular, also of several substrates in one drawer.

The aim is achieved by a substrate magazine having the features of claim 1. This has the advantage that the respective substrate is securely held mechanically in a drawer so that, even when the substrate magazine moves from one location to another, the substrates are held firmly or at least sufficiently firmly in the respective drawer, so that, in particular, shoving adjacent substrates onto each other in a drawer is reliably prevented. By means of the solution according to some embodiments, the above-mentioned aim is achieved in a cost-effective and also structurally simple manner, wherein the solution is of lasting duration and can be easily serviced or repaired if necessary. The substrate magazine according to some embodiments provides that at least one, elastically displaceable latching element be assigned to each drawer, and, when in a first, unloaded state, extend at least partially over the sliding surface of one of the guide rails of the drawer and, in a second, elastically deformed state, release the sliding surface. Thus, at least one guide rail of a drawer is assigned to a latching element which is elastically displaceable, so that, in a relaxed state, it causes a blockage assigned to the sliding surface which can be eliminated by the elastic deformation of the latching element. If a substrate is then pushed along the guide rail, it will strike against the latching element in the first state. By overcoming the spring force of the latching element, the latter is pushed back, so that the substrate can be pushed past the latching element by releasing the sliding surface. Depending upon the arrangement of the latching element along the sliding surface, the latching element in the unloaded state then blocks the sliding path in the insertion direction and/or counter to the insertion direction. If the latching element is arranged close to the push-in side of the sliding surface or of the drawer, it prevents an undesired pushing out of the latching element against the insertion direction. On the other hand, if the latching element is arranged, for example, on a push-out side facing away from the push-in side, the latching element prevents the substrate from unintentionally sliding out of the magazine again beyond the sliding surface. If, for example, the latching element is arranged centrally, relative to its longitudinal extension in the sliding direction, on the guide rail, it cooperates, for example, with an edge side of the substrate—preferably, with a lateral recess in the edge side of the substrate—in order to hold it in an interference fit or form fit on the sliding surface in a secure position in an unloaded state, or serves as a separating element between two substrates located on the sliding surface, wherein the latching element then lies between the two substrates and thereby prevents the substrates in particular from being shoved on top of each other during transport of the magazine. The substrate magazine is preferably designed either in such a way that it can be loaded and unloaded from only one side so that the push-in side also simultaneously constitutes the push-out side of the respective drawer, or in such a way that the substrate magazine can receive or discharge substrates from two sides, wherein the substrate magazine then preferably has the push-in side and the push-out side of the respective drawer on two opposite sides of the frame, so that a substrate can also be pushed completely through the frame. Preferably, at least one of the side walls of the frame is displaceably mounted in such a way that the clear width between the two side walls carrying the guide rails, and thus the spacing of guide rails lying at the same height, can be changed relative to one another, so that the width or clear width of the substrate magazine can be adapted to the width of the substrates used. Optionally, a drive for the displacement is designed to be manual, motor-driven—in particular, electromotive—hydraulic, or pneumatic.

Furthermore, it is preferably provided that the latching element be designed as an elastically deformable clamping spring which is fastened at one end to the frame and/or the guide rail, and the other end be assigned to a displaceable clamping end of the sliding surface. The latching element thus itself provides the restoring force which forces the latching element into the first state. The design as a clamping spring offers a compact embodiment of the substrate magazine, which ensures only a few individual parts for the secure holding of substrates in at least one drawer. Because the latching element or the clamping spring is fastened at one end to the frame and/or the guide rail, and the other end is assigned to the sliding surface, the latching element is designed in the manner of a spring tongue which has a free clamping end. This ensures a simple deformability counter to the spring force of the latching element when the substrates are displaced, so that the latching can be easily overcome by a corresponding application of force to the respective substrate, wherein, at the same time, an undesired displacement of the substrates is reliably prevented.

Furthermore, it is preferably provided that the clamping spring have a V-shaped or roof-shaped profile to form the clamping end. On the one hand, the V-shaped profile increases the stability of the clamping end, and, on the other, the profile ensures that the clamping end can be deformed or displaced into the second state, independently of the sliding direction of the substrate.

For this purpose, the clamping spring preferably runs in a roof-shaped manner in the clamping end, such that the clamping end in the region of the sliding surface of the assigned guide rail has an initial bevel in each sliding direction of a substrate along the guide rail. This ensures that, irrespective of the direction in which the substrate is pushed and impinges against the clamping spring, it can be transferred into the second state by displacing the substrate, while overcoming its spring force.

The clamping spring particularly preferably has a rectangular cross-section which has a height and a width, wherein the width is much smaller in comparison to the height. The clamping spring is thus designed in the manner of a leaf spring which has a low weight and advantageously fulfills the above-mentioned function by means of an elastic deformability.

In a preferred development of some embodiments, the clamping spring is aligned with its height perpendicular to the plane of the sliding surface. As a result, the clamping spring is arranged on the substrate magazine in a narrow construction and can be displaced parallel to the plane of the sliding surface, so that the clamping spring cooperates laterally with the respective substrate. This offers a simple and space-saving arrangement of the clamping spring.

In an alternative embodiment of some embodiments, it is provided that the clamping spring preferably be aligned with its height parallel to the plane of the sliding surface. As a result, the clamping spring—in particular, the leaf spring—is aligned parallel to the sliding surface, so that, by the elastic deformation, it can be displaced perpendicular to the sliding surface and thus interacts with an underside or upper side of the respective substrate at its edge region or side edge. This also ensures that the substrate is securely locked in the respective drawer, which can be released by the user if necessary.

Preferably, the frame and/or the respective guide rail each have a cutout for each clamping spring, through which at least the clamping end of the associated clamping spring extends to the sliding surface in the first state of the spring. The cutout thus ensures that the clamping end lies in the region of the sliding surface in the first state. An otherwise closed frame and/or guide rail ensures that, for example, the fastening region of the clamping spring is reliably protected against external influences, and that the entry of dirt particles into the magazine itself is made more difficult.

Furthermore, it is preferably provided that the respective clamping spring be fastened to the frame and/or the guide rail by screwing, riveting, latching, or clamping. The screw connection, riveting, latching, and/or clamping ensure simple fixing of the clamping spring to the frame and/or the guide rail by cost-effective means. The fastening can, if required, also be released nondestructively, at least in the case of screwing, latching, and/or clamping, in order, for example, to replace or remove the clamping spring for maintenance purposes.

In a further embodiment of some embodiments, the respective clamping spring is preferably welded, soldered, and/or glued to the frame and/or the guide rail at one end. This ensures a permanent connection of the clamping spring to the respective frame or the respective guide rail, which is designed to be particularly durable and robust. By means of an automated welding or soldering process, timely production of the substrate magazine with one or a plurality of clamping springs is ensured.

Furthermore, it is preferably provided that at least one guide rail be assigned two clamping springs which are arranged at a distance from one another in the sliding direction of the guide rail. For example, a clamping spring can be assigned to the push-in end, and another or further clamping spring can be assigned to the push-out end. The clamping springs are optionally arranged between the push-in side and push-out side against the guide rail, so that, for example, a substrate can be held or arranged between the push-in side and a clamping spring, another substrate can be held or arranged between the push-out side and the further clamping spring, and a third substrate can be held or arranged between the two clamping springs.

Alternatively, depending upon the design of the substrates, two substrates can also be held in the drawer, which then each have a lateral cutout which cooperates with one of the clamping springs in each case.

Furthermore, it is preferably provided that each drawer be assigned one or more clamping springs of only one guide rail of the drawer. As a result, the respective drawer has at least one clamping spring on one side, which serves to lock the one or more substrates in the drawer. This offers a cost-effective and nevertheless reliable solution.

Alternatively, each drawer is preferably assigned one or more clamping springs of one of the guide rails of the drawer. Thus, at least one clamping spring is located on each guide rail of the drawer, so that the substrate cooperates with at least two clamping springs in each case when pushed in or pushed out, and its spring force must be overcome simultaneously or successively in order to permit further pushing. This ensures a uniform loading of the substrates during displacement which prevents, for example, a substrate from tilting in the drawer.

The substrate magazine system according to some embodiments is distinguished in that a plurality of uniform substrates are present, wherein the horizontal spacing of the guide rails of a drawer relative to one another is selected such that each of the substrates can rest on both sides by an edge section on the guide rails in each case. The substrates are of uniform design, so that each substrate of the system can be securely accommodated in the substrate magazine, so that it can be placed and displaced by its two edge sections on the guide rails of a drawer. The embodiment of the substrate magazine according to some embodiments results in the substrates being able to be or also being securely held so as to be detachably locked in the respective drawer, or in at least one of the drawers. In particular, the advantages already mentioned above result. Further advantages and preferred features and combinations of features result, in particular, from what has been previously described and from the claims. The substrates are preferably printed circuit boards, wafers, solar cells, or carriers which are manufactured, for example, from ceramic or plastic. By optionally designing the substrate magazine such that at least one of the side walls with the guide rail or guide rails located thereon can be displaced in order to vary the clear width between the guide rails or side walls, substrates of a different width can also be inserted into the substrate magazine system.

In a preferred development of the substrate magazine, it is provided that the at least one clamping spring be arranged centrally on the guide rail in such a way that a substrate can be arranged between the clamping spring and the push-in side and between clamping spring and the push-out side in each case. If two clamping springs are assigned to the guide rail, these are preferably spaced apart from one another to such an extent that a further substrate can be received between the clamping springs. The one clamping spring is preferably arranged far enough from the push-in side of the respective guide rail, and the other clamping spring is preferably arranged far enough from the push-out side of the respective guide rail that a total of three substrates can be received in the drawer and locked by the clamping springs.

In a preferred development of some embodiments, each substrate has at least one lateral notch in at least one of the edge sections, wherein the notch is designed to receive the clamping end of one of the clamping springs. As a result, the clamping spring cooperates directly with the respective substrate and easily locks the substrate in both sliding directions. Wherein the preferred embodiment of the clamping end with a roof-shaped or V-shaped profile ensures that the substrate can be taken out of the drawer in both sliding directions, while overcoming the spring force of the clamping element.

The substrate insertion system according to some embodiments is distinguished by the substrate magazine or substrate magazine system according to some embodiments. This results in the advantages already mentioned. Further advantages and preferred features and combinations of features result, in particular, from what has been previously described and from the claims.

In a simplified perspective plan view, FIG. 1 shows a substrate insertion system 1 which has a substrate insertion device 2 by means of which substrates—in particular, printed circuit boards, wafers, solar cells, supports—in particular, support plates or support trays or the like—can be populated with identical or different—in particular electrical/electronic—components in an automated manner. The substrate insertion system 1 furthermore has a device 3 for feeding and removing substrates to be inserted into the insertion device 2, wherein the device 3 is configured as a robot arm 4 in the present case. The substrate insertion system 1 furthermore has a magazine 5 which is designed to receive the substrates to be inserted. The substrate magazine 5 serves for providing and/or receiving the substrates populated or to be populated. Optionally, the insertion system 1 has a further substrate magazine 6 so that, for example, substrates to be populated are removed from the substrate magazine 5, fed to the insertion device 2, and deposited in the further magazine 6 after the insertion process has been completed.

Figure 2:
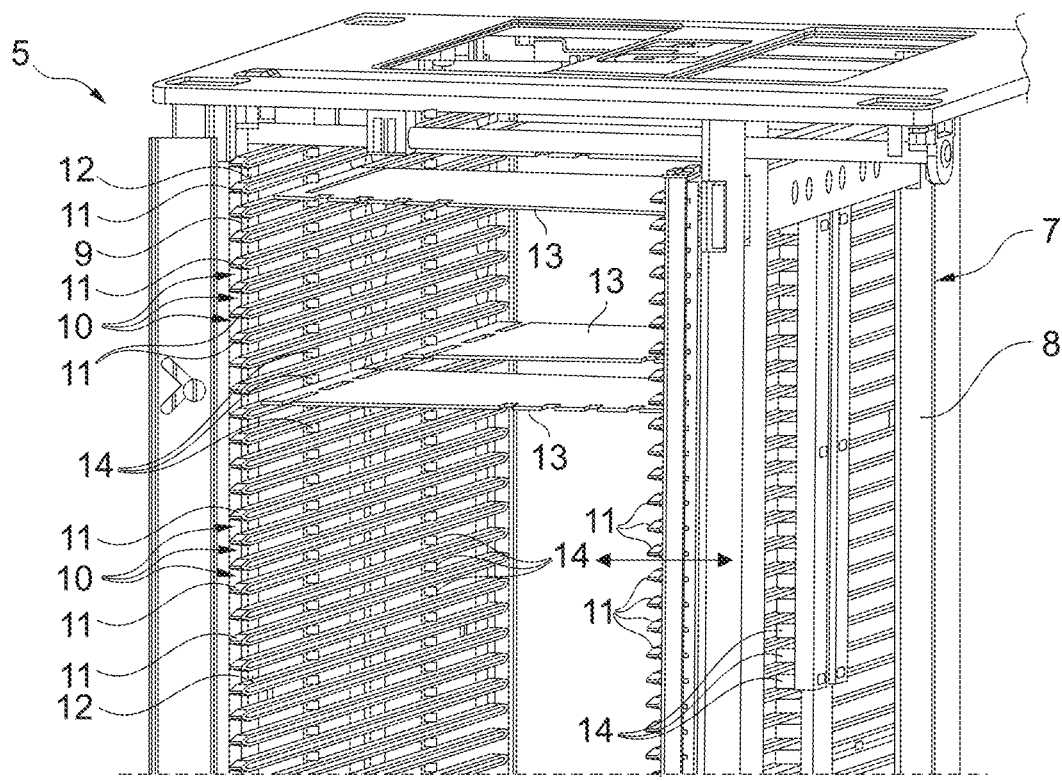
FIG. 2 shows a substrate magazine of the substrate printing system in a first perspectival view.

FIG. 2 shows an advantageous perspective view of the substrate magazine 5. The substrate magazine 5 has a frame 7 which has two side walls 8, 9 which are aligned parallel to one another and are arranged at a distance from one another, as well as a base part and a cover part which connects the side walls 8, 9 to one another. The substrate magazine 5 has a plurality of drawers 10 which lie one above the other and are oriented parallel to one another, so that at least one substrate can be arranged in each drawer 10, and several substrates can be held superimposed in the substrate magazine 5. The drawers 10 are formed by guide rails 11 arranged on the side walls 8, 9 and extending along the respective side walls 8, 9. In this case, two guide rails 11 in each case are arranged on the side walls 8, 9 at the same height as that of the frame 7 and on the mutually-facing side surfaces of the side walls 8, 9. Each of the guide rails 11 has a sliding surface 12 on which a substrate can be placed and displaced on the edge side. FIG. 2 shows, by way of example, several substrates 13 whose width B is slightly smaller than the distance of the side walls 8, 9 from one another, so that the substrates with their edge section assigned to the respective side wall 8, 9 always rest flat on a sliding surface 12 of a guide rail 11. As a result, the substrates 13 are displaceably mounted along the guide surfaces in the magazine 5. Depending upon the length L of the substrates 13, one or more substrates 13 can thereby be arranged side-by-side or one behind the other in a drawer 10. At least one of the side walls—in the present case, the side wall 8—is displaceably arranged in the frame 7 in such a way that the distance between the side walls 8, 9 is variable, as indicated by a double arrow in FIG. 2. The substrate magazine width can thereby be adapted to the width of the substrates 13 used or to be used.

Associated with each guide rail 11 in the present exemplary embodiment are several, elastically displaceable latching elements 14 which, in a first, unloaded state, extend at least partially over the respective sliding surface 12 and, in a second, elastically deformed state, release the respective sliding surface 12.

Figure 3A:
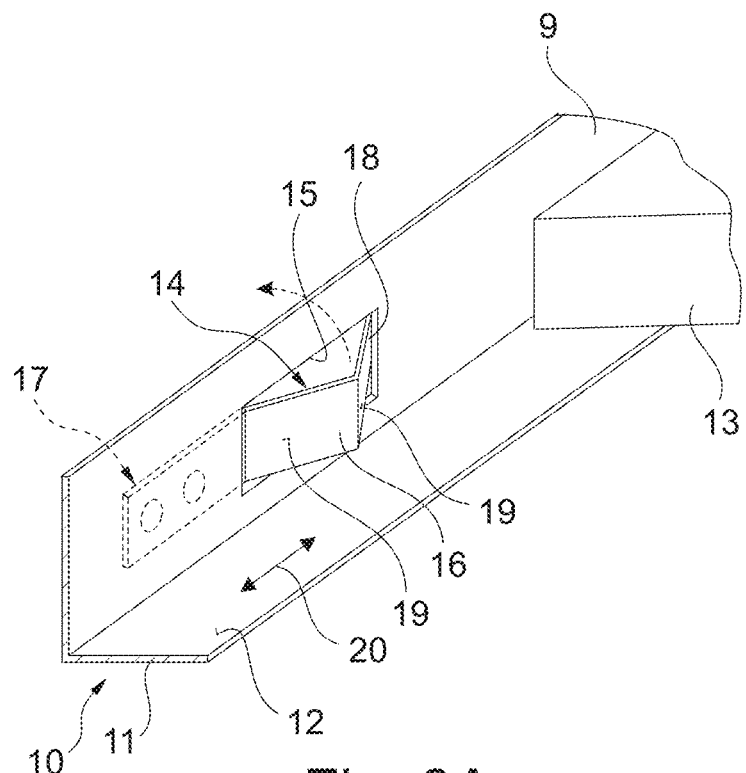
FIGS. 3A and 3B show two exemplary embodiments of a latching element of the substrate magazine.
Figure 3B:
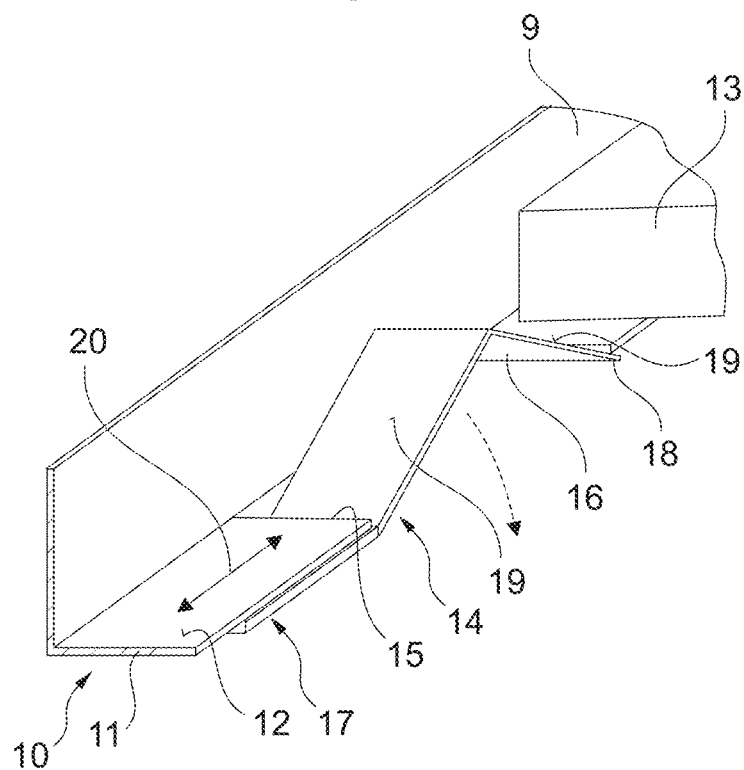

FIGS. 3A and 3B show different exemplary embodiments of the latching elements 14 in a simplified detailed view. For this purpose, FIG. 3A shows a perspective view of a part of the frame 7 looking toward a guide rail 11 on the side wall 9 of the frame 7, representative of all guide rails 11 of the substrate magazine 5. The sliding surface 12 of the guide rail 11 is oriented to be at least substantially perpendicular to the plane of the side wall 9. A cutout 15 is formed above the sliding surface 12 in the side wall 9, through which the latching element 14 extends sectionally, so that it blocks the sliding surface 12 in the sliding direction, as shown in FIG. 2A. The latching element 14 is designed as an elastically deformable clamping spring 16, which is of leaf-spring design. For this purpose, the clamping spring has a cross-section with a height H and a width B, wherein the height H is much greater than the width B. The height is oriented to be perpendicular to the sliding surface 12 so that the leaf spring is oriented to be substantially perpendicular to the sliding surface 12 and thus parallel to the side wall 9. At a first end 17, the clamping spring 16 is fastened to the side wall 9 of the frame 7. For this purpose, for example, the clamping spring 16 is welded, soldered, screwed, or clamped to the frame 9—in particular, to the end 17. Through a preferred releasable attachment, a simple exchange of the clamping springs 16 for maintenance purposes is possible. At its second end remote from the end 17, the clamping spring 16 forms a clamping end 18 which has a roof-shaped or V-shaped contour in the longitudinal extent of the clamping spring 16. With this clamping end 18, the latching element 14 projects above the sliding surface 12 from the side wall 9 so that it covers the sliding surface 12 at least sectionally. In the present exemplary embodiment, the first end 17 is arranged on the side of the side wall 9 facing away from the guide rail 11, so that the clamping end 18 is guided through the cutout 15 in the side wall 9. Alternatively, the clamping spring 16 is arranged overall on the side of the side wall 9 facing the guide rail 11.

Due to the elastically deformable design of the clamping spring 16, the clamping end 18 can be displaced in the direction of the side wall 9 with elastic deformation of the clamping spring 16 until it releases the sliding surface 12 completely, or at least to such an extent that a substrate can be pushed past the clamping end 18. As a result of the roof-shaped or V-shaped contour of the clamping end 18, the latter forms two initial slopes 19 which interact with a substrate lying on the guide rail 11 when the substrate is displaced in one or the other sliding directions along the guide rail, as indicated by an arrow 20 in FIG. 2A. Thus, the V-shaped clamping end 18 ensures that, irrespective of the sliding direction of the substrate 13 on the guide rail 11, the clamping end 18 can be displaced by the substrate 13 into the second state, so that the substrate 13 can be moved past the clamping spring 16. However, the clamping spring 16 cannot be transferred to the second state until a sufficiently high compressive force is exerted on the clamping end 18 by the substrate 13. This ensures that accidental displacement or undesired displacement of the substrate 13 on the respective guide rail 11 by the clamping spring 16 is reliably prevented. In particular, this prevents the substrate 13 from being displaced during transport of the magazine in the drawer 10. In particular, the clamping spring 16 prevents substrates 13 lying one behind the other in the drawer 10 from being unintentionally pushed one above the other in the sliding direction. Secure transport of a plurality of substrates 13 in the substrate magazine 5 is thereby reliably ensured.

FIG. 3B shows an alternative embodiment of the latching element 14, which differs from the previous embodiment in that the clamping spring 16 is not arranged laterally on the side wall 9, but directly on the guide rail 11, and is aligned with its height parallel to the plane of the sliding surface 12. Correspondingly, in this case, the opening 15 is not formed in the side wall 9, but in the guide rail 11, so that the clamping end 18 projects from below over the sliding surface 12 and thereby lies in the movement path of a substrate along the sliding surface 12. When the spring force of the clamping springs 16 is overcome, the clamping end 18 is forced downward, as indicated by an arrow in FIG. 3B, thereby releasing the sliding path along the guide surface 12. Here, too, the first end 17 of the clamping spring 16 is, preferably, permanently fastened to the guide rail 11 by one or more welding points or soldering points, or is releasably held on the guide rail 11 by a screw connection or clamping. The roof-shaped profile of the clamping end 18 also ensures that the clamping end 18 can be transferred, independently of the sliding direction of the substrate 13, into the second state releasing the sliding surface. Alternatively, the clamping spring 16 is arranged such that it protrudes from above into the sliding path of the substrate 13 and is also fastened to the overlying guide rail 11, for example.

As shown in FIG. 2, the guide rails 11 are at least partially assigned to several clamping springs 16. In the present exemplary embodiment of FIG. 2, each drawer is assigned one clamping spring 16 on the side wall 8, and two clamping springs 16 on the side wall 9.

Figure 4:
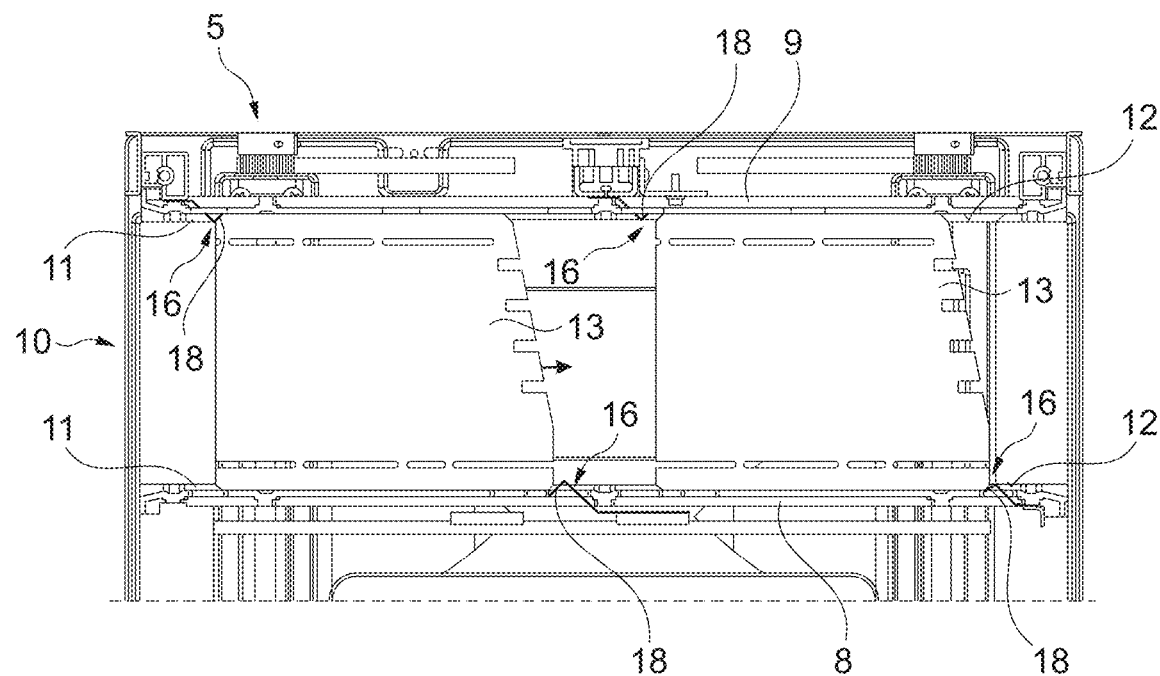
FIG. 4 shows a simplified plan view of a drawer of the substrate magazine according to a first exemplary embodiment.

FIG. 4 shows in this regard the substrate magazine 5 in a simplified plan view of a drawer 10. The side walls 8, 9 are arranged far enough apart for the edge side of the substrates 13 to be able to rest on the respective opposite guide rails 11 of the drawer 10. Two clamping springs 16 which are formed according to the exemplary embodiment of FIG. 3A are assigned to both guide rails 11 of the drawer 10 in each case. The clamping springs 16 on the side wall 8 are arranged offset relative to the clamping springs 16 on the side wall 9 in the sliding direction of the substrates 13 in such a way that one of the substrates 13 can be placed between a clamping spring 16 on the side wall 9, and on the clamping spring 16 on the side wall 8. The offset of the clamping springs 16 on the side walls 8 and 9 relative to one another is thus selected to be large enough for the distance measured in the sliding direction to be greater than the length of the respective substrate 13. In this case, a first clamping spring 16 is assigned to the push-in side of the drawer 10, and a further clamping spring 16 is assigned to the push-out side of the drawer 10, so that an inadvertent release of the substrates 13 from the magazine 5 is, on the whole, prevented. The two remaining clamping springs 16 are located in a central region of the respective drawer and ensure that the substrates 13 cannot be slid over each other or against each other.

The clamping ends 18 of the clamping springs 16 are forced back by the insertion of the substrates 13 so that the substrates 13 each come to rest in the gap between two clamping springs which are arranged sequentially on different side walls 8, 9 of the frame 7 in the longitudinal extension. As a result, each substrate 13 is provided with a position region by two clamping springs 16 each, in which the respective substrate 13 is located, and in which the respective substrate 13 is securely held and prevented from being unintentionally displaced in the drawer 10. The holding force of the respective clamping spring 16 is easily overcome by means of the device 3 when one of the substrates is removed or fed in. When transporting the—in particular—mobile substrate magazine 5, e.g., to a further production line in which the inserted substrates 13 are to be used, the substrates 13 are, however, held at the desired location by the clamping elements 16.

Figure 5:
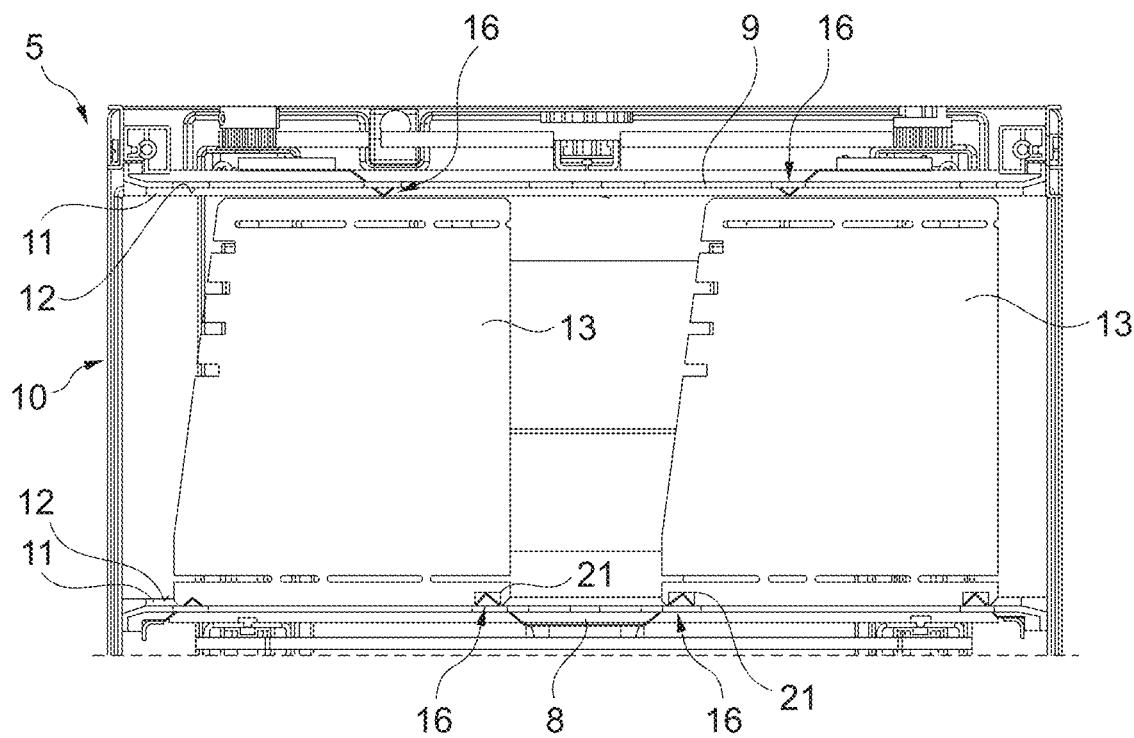
FIG. 5 shows a simplified plan view of a drawer of the substrate magazine according to a second exemplary embodiment.

FIG. 5 shows another exemplary embodiment of the substrate magazine 5 which differs from the previous exemplary embodiment in that the clamping springs 16 present here cooperate with the side edge sections of the respective substrate 13. According to the present exemplary embodiment, four clamping springs 16 are arranged on the side wall 8 and are designed according to the exemplary embodiment of FIG. 3A. The middle two clamping springs 16 are integrally connected to one another at their ends 17, such that the clamping ends 18 are ultimately formed by a common clamping spring 16.

By contrast, only two clamping springs 16 are arranged on the opposite side on the side wall 9, and are likewise designed according to the exemplary embodiment of FIG. 3A.

Unlike the preceding exemplary embodiment, the clamping springs or the clamping ends 18 of the clamping springs 16 are arranged such that a substrate 13 is not held in the sliding direction between two clamping springs; instead, the clamping ends 18 interact with the side edge section of the respective substrate 13 in a clamping manner. The locking of the respective substrate 13 in the drawer 10 is also ensured by the spring force and the resulting static friction between the clamping springs 16 and the respective substrate 13.

Optionally, a substrate magazine system is available in which the substrates 13 are matched to the substrate magazine 5 in such a way that they have lateral cutouts 21 in at least one side edge, in which the clamping end 18 of a spring element 16 can engage, as shown by way of example in FIG. 5. As a result, the respective substrate 13 is detachably locked in the drawer 13 not only in an interference fit, but also in a form fit. In the exemplary embodiment of FIG. 5, the substrates 13 have the cutouts 21 in only one edge section so that, on the opposite side, the clamping spring 16 present there forces the substrate 13 against the side wall 8, whereby the locking is further improved. In both cases, the locking can be released by overcoming the respective spring force.

Of course, other arrangements of clamping springs 16—in particular, also a different number of clamping springs 16—on the respective guide rail 11 are also conceivable, so that, for example, more than two substrates 13 can also be securely held in the respective drawer 10 in a sliding direction at a distance from one another.

What is claimed is:

1. A substrate magazine for a substrate insertion system, comprising:
    a frame comprising a plurality of drawers for receiving in each drawer at least one flat substrate of a plurality of flat substrates, the drawers arranged one above the other,
    wherein each drawer is formed by two guide rails, arranged in parallel and spaced apart from each other at a same height on the frame, each with a sliding surface on which the at least one flat substrate is configured to be displaced resting on its edge,
    wherein each drawer is assigned at least one elastically displaceable latching element which, in a first state extends at least partially over the sliding surface of one of the guide rails of a respective drawer of the plurality of drawers, and, in a second state, releases the sliding surface, wherein in the first state, the latching element is unloaded and in the second state, the latching element is elastically deformed,
    wherein the at least one elastically displaceable latching element is designed as an elastically deformable clamping spring which is fastened at a first end to the frame or one of the guide rails, and at a second end forms a displaceable clamping end, and
    wherein the frame or the assigned guide rail has, for each clamping spring, a respective cutout through which at least the clamping end of the clamping spring extends in the first state to the sliding surface,
    wherein each clamping spring extends in a V-shaped manner in the clamping end in such a way that the clamping end in a region of the sliding surface of the assigned guide rail has an initial bevel in each sliding direction along the assigned guide rail.

2. The substrate magazine according to claim 1, wherein the at least one elastically displaceable latching element is assigned to a push-in side of the respective drawer.

3. The substrate magazine according to claim 1, wherein the at least one elastically displaceable latching element is assigned to a push-out side of the respective drawer.

4. The substrate magazine according to claim 1, wherein the at least one elastically displaceable latching element is arranged on one of the guide rails, the one of the guide rails between a push-in side and a push-out side.

5. The substrate magazine according to claim 1, wherein the clamping spring has a rectangular cross-section which has a height and a width, wherein the width is much smaller in comparison to the height.

6. The substrate magazine according to claim 1, wherein the clamping spring is aligned with its height perpendicular to a plane of the sliding surface.

7. The substrate magazine according to claim 1, wherein the clamping spring is aligned with its height parallel to a plane of the sliding surface.

8. The substrate magazine according to claim 1, wherein the clamping spring is fastened to the frame or the assigned guide rail by screwing, riveting, latching, or clamping.

9. The substrate magazine according to claim 1, wherein the clamping spring is welded, soldered, and/or glued at the first end to the frame.

10. The substrate magazine according to claim 1, wherein the clamping spring and a second clamping spring are assigned to the one of the guide rails whereby the clamping spring and second clamping spring are arranged at a distance from one another in a each sliding direction of the one of the guide rails.

11. The substrate magazine according to claim 1, wherein each drawer has the at least one clamping spring assigned to only one of the two guide rails of the drawer.

12. The substrate magazine according to claim 1, wherein each drawer has the at least one clamping spring assigned to the guide rails of the drawer.

13. A substrate magazine system with the substrate magazine according to claim 1 and with the plurality of flat substrates, wherein for each drawer the two guide rails have a horizontal distance from one another which is sufficiently large such that the at least one flat substrate of the plurality of flat substrates can rest on the two guide rails on both sides with a respective edge.

14. The substrate magazine system according to claim 13, wherein the at least one clamping spring includes two clamping springs, and wherein a distance between the two clamping springs assigned to one guide rail of the two guide rails is greater than a length of the edge of the substrates.

15. The substrate magazine system according to claim 13, wherein each substrate has at least one lateral cutout in at least one of the respective edges which is designed to receive the at least one clamping end of the clamping spring.

16. A substrate insertion system for populating substrates with, in particular, electrical/electronic components, having the substrate magazine according to claim 1.

* * * * *